(12) United States Patent
Yamauchi (10) Patent No.: US 6,377,505 B1
(45) Date of Patent: Apr. 23, 2002

(54) SEMICONDUCTOR INTEGRATED CIRCUIT CAPABLE OF REDUCING AREA OCCUPIED BY DATA BUS (75) Inventor: Tadaaki Yamauchi, Hyogo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 09/737,739

(22) Filed: Dec. 18, 2000

(30) Foreign Application Priority Data

Jun. 5, 2000 (JP) ........................................ 2000-167097

(51) Int. Cl.[7] .................................................. G11C 8/00

(52) U.S. Cl. ............................ 365/230.03; 365/189.01; 365/230.06

(58) Field of Search ........................... 365/230.03, 231, 365/189.01, 207, 230.06

(56) References Cited

U.S. PATENT DOCUMENTS

| 5,553,023 | A | * | 9/1996 | Lau et al. | ............... | 365/189.01 |
| 6,144,615 | A | * | 11/2000 | Toda | ........................... | 365/233 |
| 6,209,056 | B1 | * | 3/2001 | Suh | ............................... | 711/5 |
| 6,278,647 | B1 | * | 8/2001 | Saitoh et al. | .......... | 365/230.03 |

FOREIGN PATENT DOCUMENTS

JP           4-119590           4/1992

* cited by examiner

Primary Examiner—David Nelms
Assistant Examiner—Thong Le
(74) Attorney, Agent, or Firm—McDermott, Will & Emery (57) ABSTRACT A semiconductor integrated circuit includes a first bank, a first input/output circuit, a second bank, a second input/output circuit, a data bus, and a plurality of circuits. The first and second banks are each divided into four blocks. Data buses formed of data buses for inputting/outputting data to/from a memory cell included in each block are arranged to cross at points A, B, C between adjacent two circuits of the plurality of circuits. Consequently, the area occupied by the data buses can be made smaller.

10 Claims, 10 Drawing Sheets

SEMICONDUCTOR INTEGRATED CIRCUIT CAPABLE OF REDUCING AREA OCCUPIED BY DATA BUS

BACKGROUND OF THE INVENTION

1. Field of the Invention

The present invention relates to semiconductor integrated circuits and more particularly to a semiconductor integrated circuit capable of reducing an area occupied by a data bus.

2. Description of the Background Art

Figure 10:
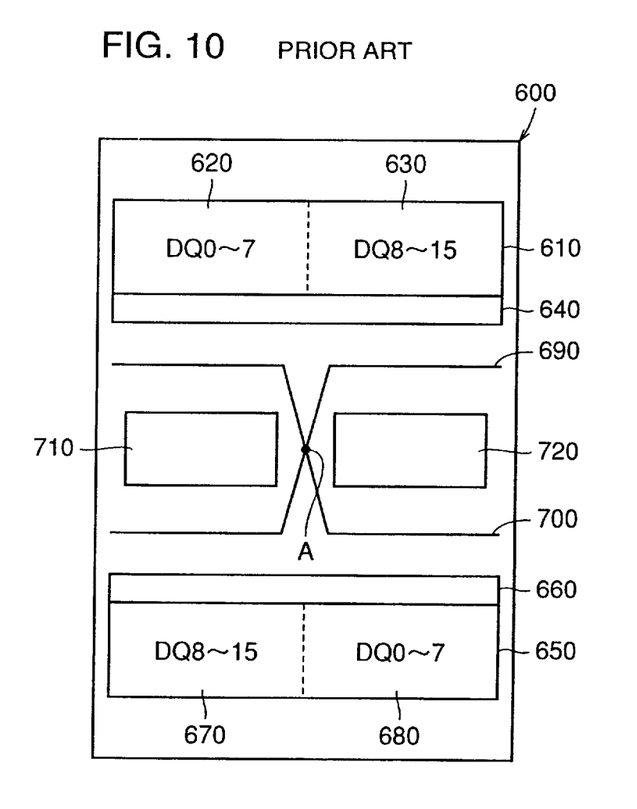
FIG. 10 is a schematic block diagram of a conventional semiconductor integrated circuit.

A data bus in a conventional semiconductor integrated circuit has a structure as shown in FIG. 10. A semiconductor integrated circuit 600 includes a first bank 610, a first input/output circuit 640, a second bank 650, a second input/output circuit 660, data buses 690, 700, and circuits 710, 720. First bank 610 is divided into a first block 620 and a second block 630, and second bank 650 is divided into a first block 670 and a second block 680. First block 620 of first bank 610 and second block 680 of second bank 650 include memory cells inputting/outputting data through input/output terminals DQ0 to 7, and second block 630 of first bank 610 and first block 670 of second bank 650 include memory cells inputting/outputting data through input/output terminals DQ8 to 15.

First and second input/output circuits 640, 660 are each formed of an amplification circuit (PA), a write buffer (WB), and a read driver (RDRV). The amplification circuits (PA) amplify data read out from the memory cells included in first and second blocks 620, 630, 670, 680 of first and second banks 610, 650. The read drivers (RDRV) output the data amplified by the amplification circuits (PA) to data buses 690, 700. The write buffers (WB) receive data input from input/output terminals DQ0 to 15 through data buses 690, 700, and write the received data to the memory cells included in first and second blocks 620, 630, 670, 680 of first and second banks 610, 650. Circuits 710, 720 are each formed of a pad or an input/output interface circuit.

Data bus 690 is connected to the memory cells inputting/outputting data through input/output terminals DQ8 to 15, and data bus 700 is connected to the memory cells inputting/outputting data through input/output terminals DQ0 to 7. Therefore, data bus 700 is arranged to extend along first block 620 of first bank 610, pass through a point A between circuits 710 and 720, and extend along second block 680 of second bank 650. In addition, data bus 690 is arranged to extend along first block 670 of second bank 650, pass through point A between circuits 710 and 720, and extend along second block 630 of first bank 610.

Figure 11:
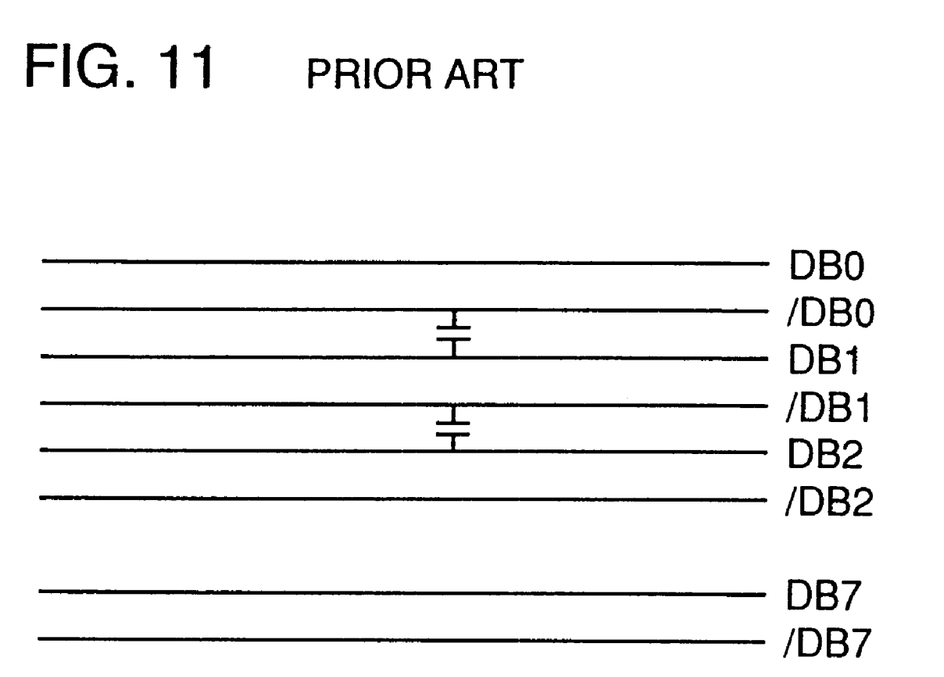
FIG. 11 is a schematic diagram of data bus pairs.

Since data buses 690, 700 each transmit 8-bit data, they are formed of eight pairs of data buses DB0, /DB0 to DB7, /DB7 as shown in FIG. 11. Data buses 690 and 700 cross at one point A.

Semiconductor integrated circuit 600 having sixteen input/output terminals DQ has been described as an example. If the number of input/output terminals DQ is increased to over sixteen, the area occupied by data buses is increased in the conventional data bus structure in which the data buses cross at one point.

If the interval of the data buses is made smaller to reduce the occupied area of the data buses, coupling capacitance causes noise between the adjacent data buses as shown in FIG. 11, making it impossible to correctly input/output data to/from memory cells.

SUMMARY OF THE INVENTION

Therefore, an object of the present invention is to provide a semiconductor integrated circuit capable of reducing the occupied area of data buses.

Another object of the present invention is to provide a semiconductor integrated circuit capable of suppressing noise from an adjacent data bus.

A semiconductor integrated circuit according to the present invention includes first and second banks having a plurality of memory cells and capable of being driven independently, a first input/output circuit writing/reading data to/from the plurality of memory cells included in the first bank, a second input/output circuit writing/reading data to/from the plurality of memory cells included in the second bank, data buses arranged between the first and second banks and connected to the first and second input/output circuits, and a plurality of circuits arranged between the first and second banks and exchanging data with the data buses, the data buses crossing between adjacent two circuits of the plurality of circuits.

In the semiconductor integrated circuit according to the present invention, the data buses for outputting data read out from the memory cells cross between adjacent two circuits of the plurality of circuits arranged between the first and second banks, and a small number of data buses cross at each crossing. Therefore, the area occupied by the data buses at the crossing can be suppressed.

Preferably, the data buses have such number of crossings that is determined based on the number of blocks obtained by dividing the first and second banks.

When there are a large number of blocks obtained by dividing the banks, the number of crossings is made larger and each data bus comprising the data buses occupies a small area at the crossing. Therefore, the area occupied by the data bus at each crossing can be suppressed.

Preferably, the data buses are formed of such number of data buses that is equal to the number of blocks obtained by dividing the first and second banks, and the data buses, respectively correspond to the blocks obtained by dividing the first and second banks.

When there are a large number of blocks obtained by dividing the banks, the data buses are formed of a large number of data buses and each data bus crosses a different crossing. Therefore, the area occupied by each data bus at each crossing can be suppressed.

Furthermore, a semiconductor integrated circuit according to the present invention includes first and second banks having a plurality of memory cells and capable of being driven independently, an input/output circuit arranged between the first and second banks and selectively writing/reading data to/from the plurality of memory cells included in the first and second banks, and a data bus inputting/outputting data through the input/output circuit.

In the semiconductor integrated circuit according to the present invention, the common input/output circuit selectively inputs/outputs data to/from the plurality of memory cells included in the first bank and the plurality of memory cells included in the second bank. Therefore, the number of data buses connected to the common input/output circuit can be minimized. As a result, the area occupied by the data buses can be suppressed.

Preferably, the input/output circuit includes an amplification circuit amplifying data from the plurality of memory cells included in the first or second bank, a driver outputting the data amplified by the amplification circuit to a data bus, a buffer inputting the data from the data bus to the plurality of memory cells included in the first or second bank, and a switch selectively connecting the amplification circuit to the first or second bank.

The amplification circuit outputting the data from the memory cells to the data bus as well as the buffer inputting the data from the data bus to the memory cells are selectively connected to the first or second bank by the switch. Therefore, the input/output circuit only has to be connected to the minimum number of data buses, and the area necessary for providing the data buses can be suppressed.

Preferably, the semiconductor integrated circuit further includes a first input/output line pair having one end connected to the first bank and the other end connected to the switch, and a second input/output line pair having one end connected to the second bank and the other end connected to the switch.

Data from a memory cell included in the first and second banks is transmitted to the switch through the first and second input/output line pairs. The data transmitted through the first input/output line pair or the data transmitted through the second input/output line pair is selectively input to the amplification circuit and the driver by the switch, amplified, and output to a data bus. The data from the data bus is transmitted to the switch through the buffer, selectively input to the first input/output line pair or the second input/output line pair by the switch, and written to a memory cell included in the first bank or a memory cell included in the second bank. Therefore, the input/output circuit only has to be connected to the minimum number of data buses, and the area necessary for providing the data buses can be suppressed.

Furthermore, a semiconductor integrated circuit according to the present invention includes a first data bus pair, a second data bus pair provided adjacent to the first data bus pair, a first bus driver outputting data from a first memory cell array to the first data bus pair, a second bus driver outputting data from a second memory cell array to the second data bus pair, a first potential rise prevention circuit provided between data buses of the first data bus pair and preventing potential rise of one data bus of the first data bus pair due to coupling from the second data bus pair when the second bus driver outputs data to the second data bus pair, and a second potential rise prevention circuit provided between data buses of the second data bus pair and preventing potential rise of one data bus of the second data bus pair due to coupling from the first data bus pair when the first bus driver outputs data to the first data bus pair.

In the semiconductor integrated circuit according to the present invention, adjacent two data bus pairs exist and, if data from a memory cell is output to one data bus pair, causing a potential difference between the data bus pairs, the potential rise preventing circuit prevents the potential of the other data bus pair adjacent to the data bus having a higher potential from rising due to coupling. Therefore, potential rise due to coupling can be prevented even if the interval between adjacent two data buses is made smaller. As a result, the area necessary for providing the data buses can be suppressed.

Preferably, the first potential rise prevention circuit is driven according to driving of the first bus driver, and the second potential rise prevention circuit is driven according to driving of the second bus driver.

Since the first or second potential rise prevention circuit is driven simultaneously with outputting of data from a memory cell to a data bus, the data can be correctly output to the data bus.

Preferably, the first and second potential rise preventing circuits are provided at prescribed intervals.

Since the interval of adjacent data buses is small, potential rise due to coupling is prevented even if a long data bus pair is provided. Therefore, a larger number of data bus pairs can be provided in a small area.

Preferably, a delay circuit is further included which generates a first bus driver delay signal obtained by delaying by a prescribed amount a first bus driver drive signal for driving the first bus driver, and a second bus driver delay signal obtained by delaying by a prescribed amount a second bus driver drive signal for driving the second bus driver. The first potential rise prevention circuit is driven according to the first bus driver delay signal, and the second potential rise prevention circuit is driven according to the second bus driver delay circuit.

After a prescribed time period has elapsed since the first and second bus driver outputting data from a memory cell to a data bus pair are driven, the first and second potential rise prevention circuits are driven. Therefore, a malfunction of the first and second potential rise prevention circuits can be prevented even if H level spike noise appears on a data bus on the lower potential side of the data bus pair.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

In the following, the embodiments of the present invention will be described in detail with reference to the drawings. In the drawings, the same or corresponding parts are designated by the same reference characters and description thereof will not be repeated.

First Embodiment

Figure 1:
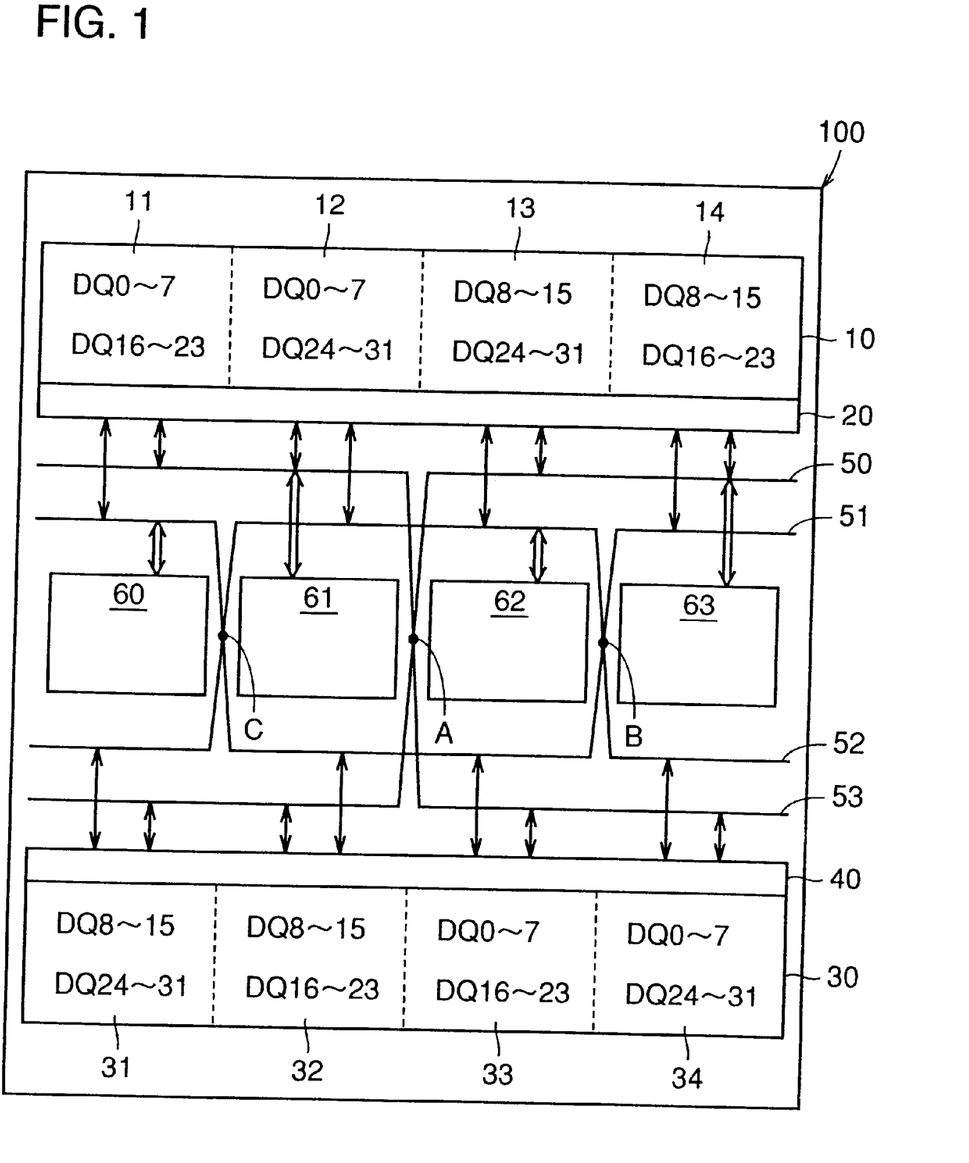
FIG. 1 is a schematic block diagram of a semiconductor integrated circuit according to a first embodiment.

A semiconductor integrated circuit according to a first embodiment of the present invention will be described. Referring to FIG. 1, a semiconductor integrated circuit 100 according to the present invention includes a first bank 10, a first input/output circuit 20, a second bank 30, a second input/output circuit 40, data buses 50 to 53, and a plurality of circuits 60 to 63. First bank 10 is divided into a first block 11, a second block 12, a third block 13, and a fourth block 14. First block 11 includes memory cells to/from which data is input/output through input/output terminals DQ0 to 7 and DQ16 to 23, second block 12 includes memory cells to/from which data is input/output through input/output terminals DQ0 to 7 and DQ24 to 31, third block 13 includes memory cells to/from which data is input/output through input/output terminals DQ8 to 15 and DQ24 to 31, and fourth block 14 includes memory cells to/from which data is input/output through input/output terminals DQ8 to 15 and DQ16 to 23.

Second bank 30 is divided into a first block 31, a second block 32, a third block 33, and a fourth block 34. First block 31 includes memory cells to/from which data is input/output through input/output terminals DQ8 to 15 and DQ24 to 31, second block 32 includes memory cells to/from which data is input/output through input/output terminals DQ8 to 15 and DQ16 to 23, third block 33 includes memory cells to/from which data is input/output through input/output terminals DQ0 to 7 and DQ16 to 23, and fourth block 34 includes memory cells to/from which data is input/output through input/output terminals DQ0 to 7 and DQ24 to 31.

First input/output circuit 20 is provided adjacent to first bank 10, and second input/output circuit 40 is provided adjacent to second bank 30. A plurality of circuits 60 to 63 are arranged between first bank 10 and second bank 30, and data buses 50 to 53 are arranged between circuits 60 to 63 and first bank 10 as well as between circuits 60 to 63 and second bank 30. Data buses 50 and 53 cross at a point A, and data buses 51 and 52 cross at points B and C. Data bus 50 is provided for memory cells inputting/outputting data through input/output terminals DQ8 to 15, data bus 51 is provided for memory cells inputting/outputting data through input/output terminals DQ16 to 23, data bus 52 is provided for memory cells inputting/outputting data through input/output terminals DQ24 to 31, and data bus 53 is provided for memory cells inputting/outputting data through input/output terminals DQ0 to 7. Therefore, data bus 50 is arranged to extend along first and second blocks 31, 32 of second bank 30, pass through point A between circuits 61, 62, and extend along third and fourth blocks 13, 14 of first bank 10. Data bus 51 is arranged to extend along first block 11 of first bank 10, pass through point C between circuits 60, 61, extend along second and third blocks 32, 33 of second bank 30, pass through point B between circuits 62, 63, and extend along fourth block 14 of first bank 10. Data bus 52 is arranged to extend along first block 31 of second bank 30, pass through point C between circuits 60, 61, extend along second and third blocks 12, 13 of first bank 10, pass through point B between circuits 62, 63, and extend along fourth block 34 of second bank 30. Furthermore, data bus 53 is arranged to extend along first and second blocks 11, 12 of first bank 10, pass through point A between circuits 61, 62, and extend along third and fourth blocks 33, 34 of second bank 30. As a result, the data buses formed of data buses 50 to 53 cross at points A, B, C which correspond to locations for dividing first and second banks 10, 30 into four.

Since data buses 50 to 53 are each for exchanging 8-bit data with the input/output terminals, they are formed of eight data bus pairs.

First input/output circuit 20 outputs data from a memory cell included in blocks 11 to 14 of first bank 10 to data buses 50 to 53, and inputs data from data buses 50 to 53 to a memory cell included in blocks 11 to 14 of first bank 10. Similarly, second input/output circuit 40 outputs data from a memory cell included in blocks 31 to 34 of second bank 30 to data buses 50 to 53, and inputs data from data buses 50 to 53 to a memory cell included in blocks 31 to 34 of second banks 30.

Circuits 60 to 63 are each formed of a pad, an input/output buffer, and an input/output interface circuit. Data bus 51 is connected to circuit 60, data bus 53 is connected to circuit 61, data bus 52 is connected to circuit 62, and data bus 50 is connected to circuit 63.

Data read out from such a memory cell of the memory cells included in first block 11 of first bank 10 that inputs/outputs data through input/output terminals DQ0 to 7 is output to data bus 53 by first input/output circuit 20, transmitted on data bus 53, and output from input/output terminals DQ0 to 7 through the input/output interface circuit of circuit 61. Data input from input/output terminals DQ0 to 7 of circuit 61 is input to data bus 53 through the input/output interface and the input/output buffer, and written, by first input/output circuit 20, to such a memory cell of the memory cells included in first block 11 of first bank 10 that inputs/outputs data through input/output terminals DQ0 to 7. Data is input and output similarly for memory cells included in other blocks 12, 13, 14, 31, 32, 33, 34.

Semiconductor integrated circuit 100 is an integrated circuit having thirty-two input/output terminals, and first and second banks 10, 30 are each divided into four blocks. Therefore, data is input and output using four data buses 50, 51, 52, 53. In other words, such number of data buses that is equal to the number of bank-divided blocks are used to input and output data for memory cells of blocks 11 to 14 and 31 to 34.

When circuits 60 to 63 formed of an input/output interface and the like exist between first and second banks 10, 31, data buses 50 to 53 are arranged to cross at a plurality of points A, B, C to be able to reduce the number of data buses crossing at each point and to decrease the area occupied by the data buses. As a result, circuit bands such as a pad and an input/output interface can be arranged efficiently.

Figure 2:
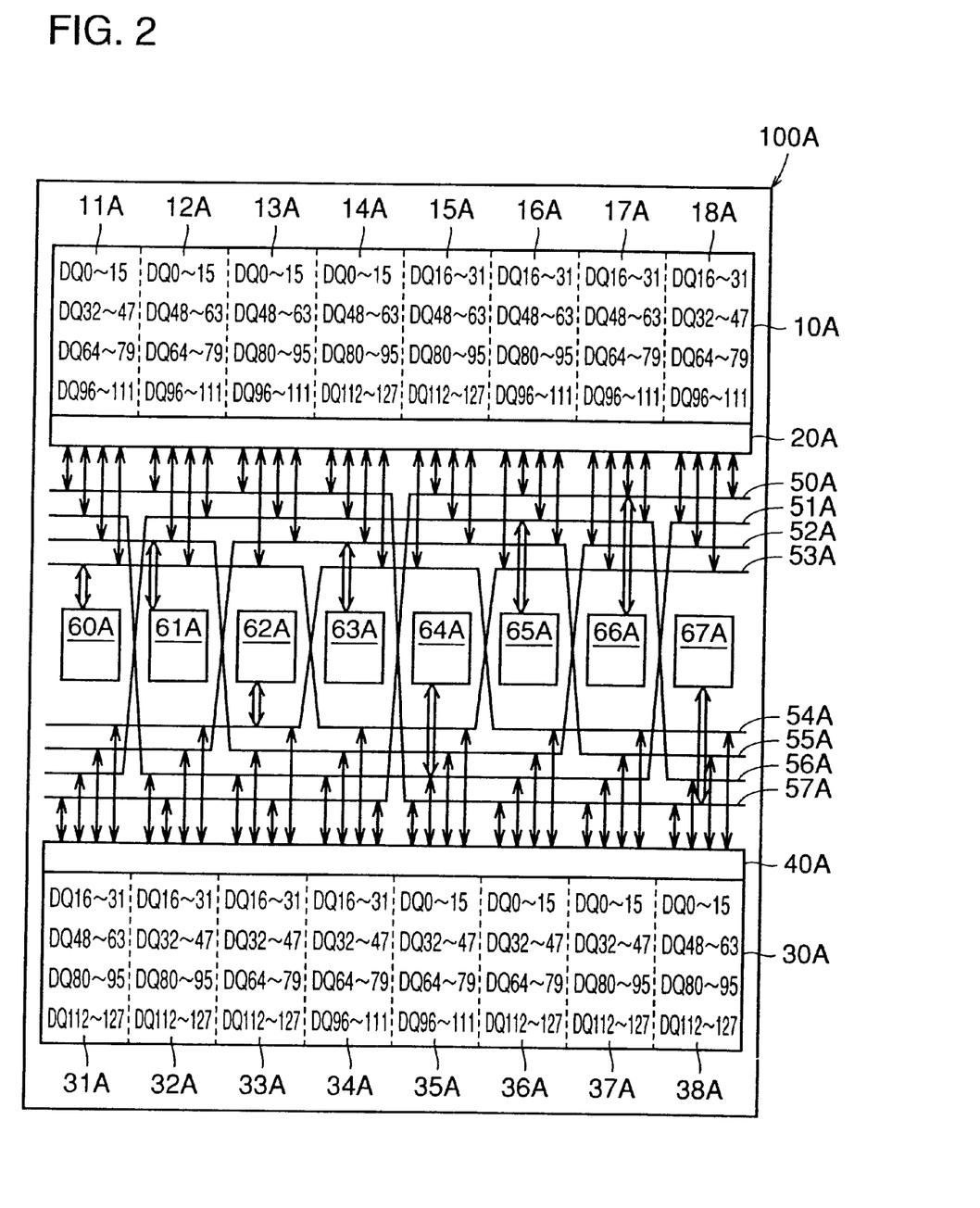
FIG. 2 is a schematic block diagram of another semiconductor integrated circuit according to the first embodiment.

Referring to FIG. 2, a semiconductor integrated circuit 100A includes a first bank 10A, a first input/output circuit 20A, a second bank 30A, a second input/output circuit 40A, data buses 50A to 57A, and a plurality of circuits 60A to 67A. First bank 10A is divided into a first block 11A, a second block 12A, a third block 13A, a fourth block 14A, a fifth block 15A, a sixth block 16A, a seventh block 17A, and an eighth block 18A. Second bank 30A is divided into a first block 31A, a second block 32A, a third block 33A, a fourth block 34A, a fifth block 35A, a sixth block 36A, a seventh block 37A, and an eighth block 38A. Semiconductor integrated circuit 100A has 128 input/output terminals DQ0 to 127 and first and second banks 10A, 30A are divided into eight blocks. Therefore, such number of data buses exist that corresponds to the number of blocks obtained by dividing first and second banks 10A, 30A, and each of data buses 50A to 57A transmits 16-bit data.

When first and second banks 10A, 30A are divided into eight blocks, there exist eight circuits 60A to 67A and eight data buses 50A to 57A. The data buses formed of data buses 50A to 57A are arranged such that data buses 50A to 57A cross between adjacent two of eight circuits 60A to 67A. Circuits 60A to 67A have the same configuration as circuits 60 to 63 of semiconductor circuit 100.

In semiconductor integrated circuit 10A, the data buses formed of data buses 50A to 57A cross at points which correspond to locations for dividing first and second banks 10A, 30A into eight. Since arrangement of 25 data buses 50A to 57A, correspondence between data buses 50A to 57A and blocks 11A to 18A, 31A to 38A and correspondence between data buses 50A to 57A and circuits 60A to 67A are similar to the case of semiconductor integrated circuit 100, data is input and output similarly for memory cells included in each block of first and second banks 10A, 30A.

Even in an integrated circuit involving 128 inputs/outputs as in semiconductor integrated circuit 10A, arrangement to cross the data buses at a plurality of points enables the area occupied by the data buses at each crossing to be smaller and circuit bands such as a pad and an input/output interface circuit to be arranged efficiently.

Although circuits 60 to 63, 60A to 67A have been described as being formed of circuit bands such as a pad and an input/output interface, this may not always be the case and circuits 60 to 63, 60A to 67A may be formed of a circuit having a logic function.

In semiconductor integrated circuits 100, 100A, the data buses have been described as crossing at points for dividing the bank into four or eight, this may not always be the case and the data buses may cross at points for dividing the bank into sixteen.

As described above, the area occupied by the data buses can be made smaller based on the structure according to the first embodiment of the present invention.

Second Embodiment

Figure 3:
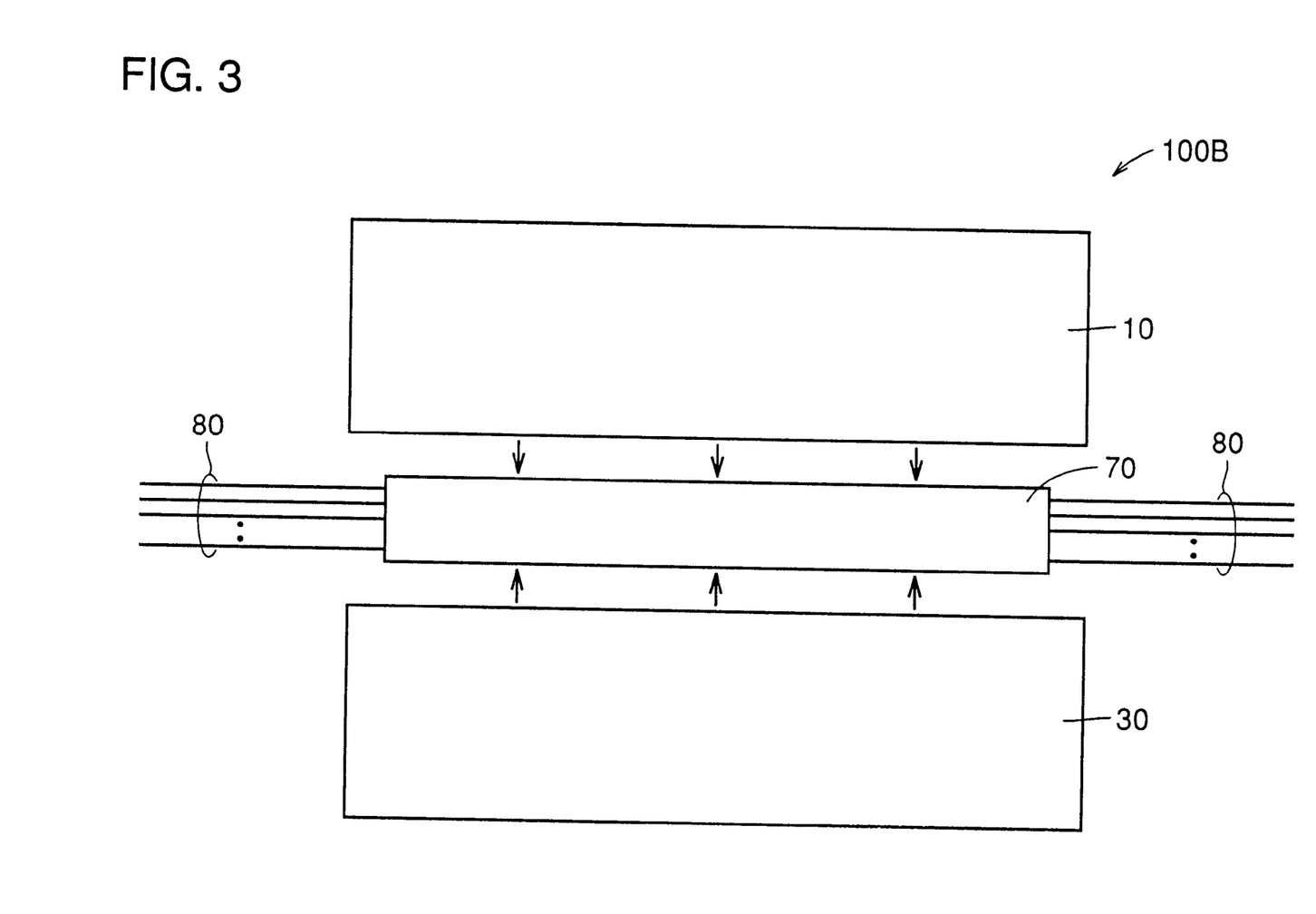
FIG. 3 is a schematic block diagram of a semiconductor integrated circuit according to a second embodiment.

Referring to FIG. 3, a semiconductor integrated circuit 100B includes a first bank 10, a second bank 30, an input/output circuit 70, and a data bus 80. Input/output circuit 70 selectively outputs data from a memory cell included in first and second banks 10, 30 to data bus 80, and selectively inputs data from data bus 80 to a memory cell included in first and second banks 10, 30. Data bus 80 transmits data from input/output circuit 70 to an input/output terminal (not shown) and inputs data from the input/output terminal to input/output circuit 70.

Figure 4:
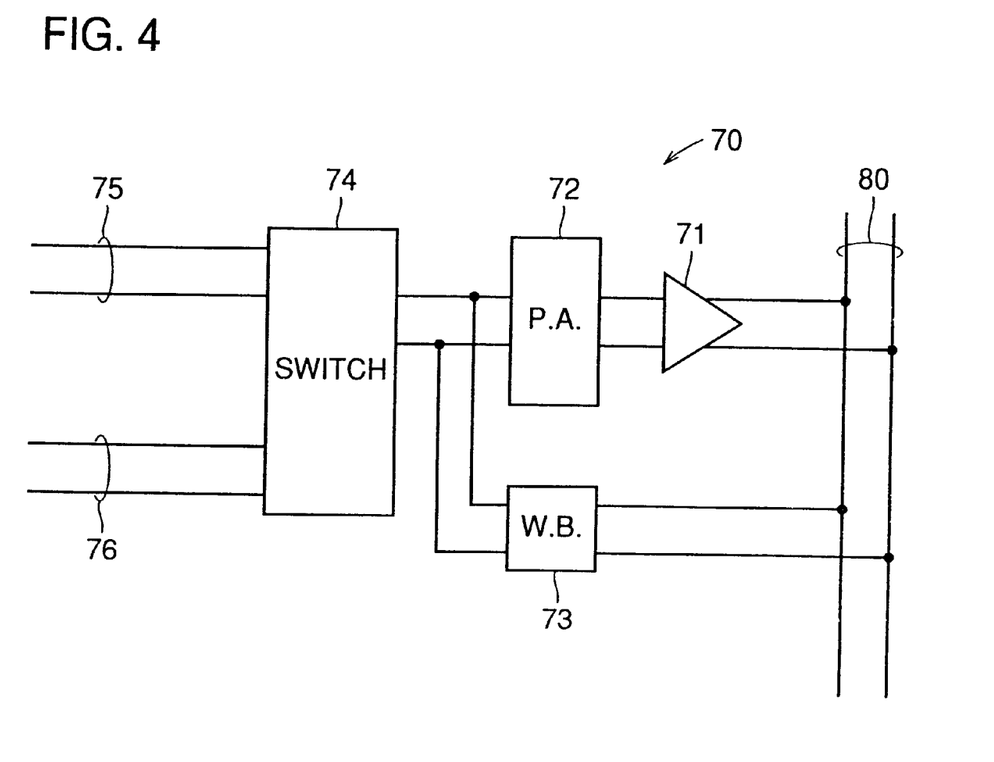
FIG. 4 is a schematic block diagram of the input/output circuit in FIG. 3.

Referring to FIG.4, input/output circuit 70 includes a driver 71, an amplification circuit 72, a buffer 73, and a switch 74. Driver 71 outputs data from amplification circuit 72 to data bus 80. Amplification circuit 72 amplifies data from switch 74 and inputs the data to driver 71. Buffer 73 inputs data from data bus 80 to switch 74. Switch 74 selectively inputs data from input/output line pairs 75, 76 to amplification circuit 72, and selectively inputs data from buffer 73 to input/output line pairs 75, 76. Input/output line pair 75 is connected to first bank 10, and input/output line pair 76 is connected to second bank 30.

When data is written to a memory cell included in first and second banks, 10, 30, data input from the input/output terminal is transmitted on data bus 80 and input to buffer 73. Buffer 73 supplies the input data to switch 74. Then, switch 74 supplies the data to input/output line pair 75 if the data is to be written to a memory cell included in first bank 10, and supplies the data to input/output line pair 76 if the data is to be written to a memory cell included in second bank 30. When the data is supplied to input/output line pair 75, the data is written to a memory cell included in first bank 10. When the data is supplied to input/output line pair 76, the data is written to a memory cell included in second bank 30.

When data is read out from a memory cell included in first bank 10, data read out from a memory cell and transmitted on input/output line pair 75 is selected by switch 74 and input to amplification circuit 72. After the data is amplified by amplification circuit 72, it is output to data bus 80 by driver 71 and transmitted to the input/output terminal by data bus 80 before it is provided as an output. When data is read out from a memory cell included in second bank 30, data read out from a memory cell and transmitted on input/output line pair 76 is selected by switch 74. Thereafter, the process is the same as the case where data is read out from a memory cell included in first bank 10.

Referring again to FIG. 3, input/output circuit 70 selectively writes/reads data to/from a memory cell included in first bank 10 and a memory cell included in second bank 30. Therefore, one input/output circuit is sufficient for selectively writing/reading data to/from a memory cell included in the two banks, and the number of data buses connected to the one input/output circuit can be minimized.

As described above, the area occupied by the data buses and the input/output circuit can be made smaller based on the structure according to the second embodiment of the present invention.

Third Embodiment

Figure 5:
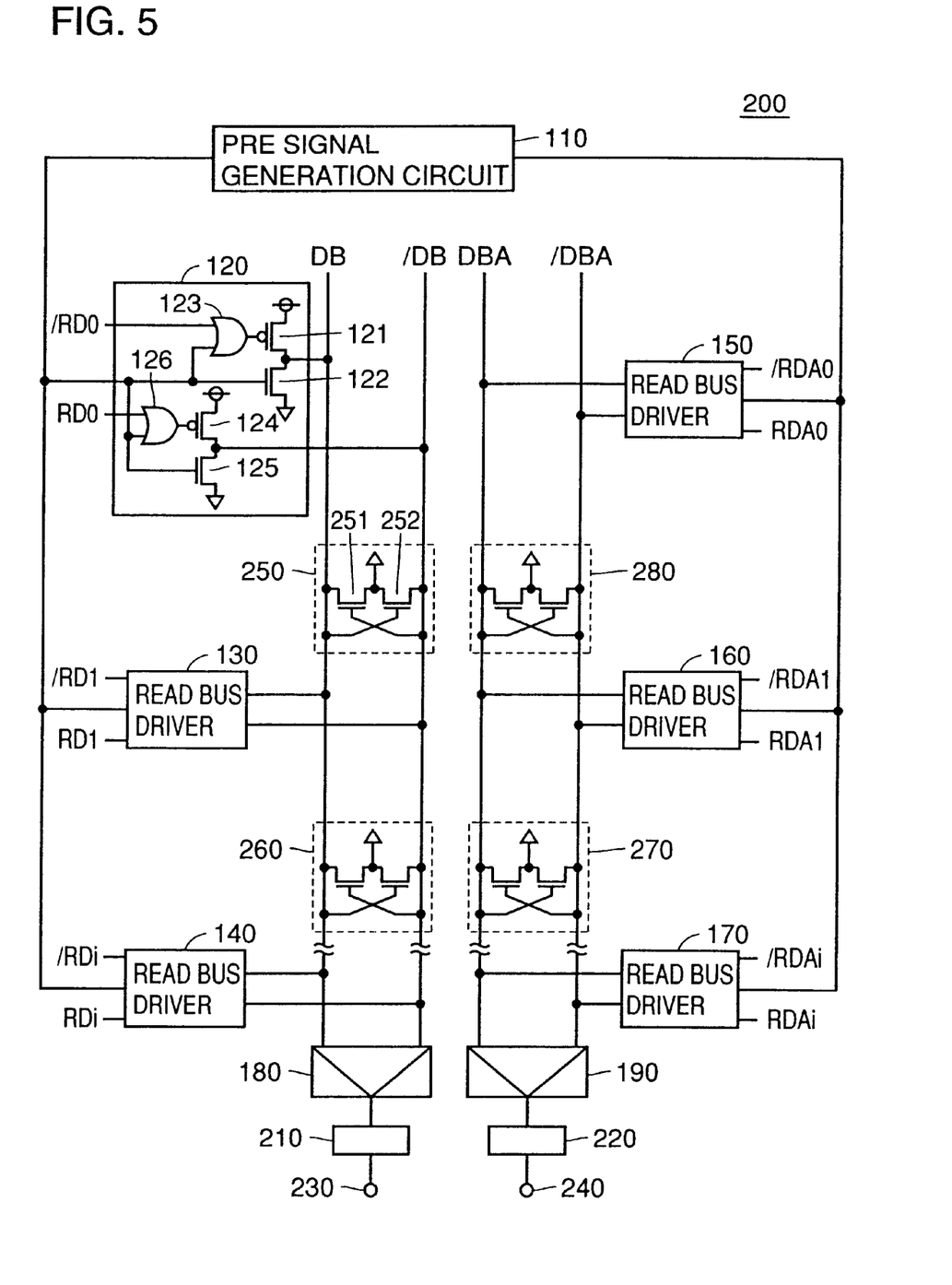
FIG. 5 is a schematic block diagram of a semiconductor integrated circuit according to a third embodiment.

Referring to FIG. 5, a semiconductor integrated circuit 200 includes a PRE signal generation circuit 110, read bus drivers 120, 130, 140, 150, 160, 170, and potential rise prevention circuits 250, 260, 270, 280. PRE signal generation circuit 110 generates a PRE signal. Read bus driver 120 outputs data from a pair of input/output lines RD0, /RD0 to a pair of data buses DB, /DB, read bus driver 130 outputs data from a pair of input/output lines RD1, /RD1 to the pair of data buses DB, /DB, and read bus driver 140 outputs data from a pair of input/output lines RD1, /RD1 to the pair of data buses DB, /DB. In addition, read bus driver 150 outputs data from a pair of input/output lines RDA0, /RDA0 to a pair of data buses DBA, /DBA, read bus driver 160 outputs data from a pair of input/output lines RDA1, /RDA1 to the pair of data buses DBA, /DBA, and read bus driver 170 outputs data from a pair of input/output lines RDA1, /RDA1 to the pair of data buses DBA, /DBA.

Potential rise prevention circuits 250, 260 are circuits provided between the pair of data buses DB, /DB and preventing the potential of data bus /DB from rising due to coupling from data bus DBA. Potential rise prevention circuits 270, 280 are circuits provided between the pair of data buses DBA, /DBA and preventing the potential of data bus /DBA from rising due to coupling from a data bus pair (not shown) adjacent to the pair of data buses DBA, /DBA.

Read bus driver 120 includes P channel MOS transistors 121, 124, N channel MOS transistors 122,125, and NOR gates 123,126. For the pair of input/output lines RD0, /RD0, a signal on input/output lines /RD0 is input to NOR gate 123, and a signal on input/output line RD0 is input to NOR gate 126. The PRE signal is input to N channel MOS transistors 122, 125. When the PRE signal at an L (logic low) level is input, read bus driver 120 is driven and N channel MOS transistor 122 is turned off. Since the signal on input/output line /RD0 is an L level signal, NOR gate 123 outputs an L level signal and P channel MOS transistor 121 is turned on. Then, data bus DB assumes an H (logic high) level. On the other hand, since the signal on input/output line RD0 is an H level signal, NOR gate 126 outputs an H level signal and P channel MOS transistor 124 is turned off. Then, data bus /DB assumes an L level. Read bus drivers 130, 140, 150, 160, 170 have the same structure as read bus driver 120.

Potential rise prevention circuit 250 includes two N channel MOS transistors 251, 252 connected in series between the pair of data buses DB, /DB. N channel MOS transistor 251 has its gate terminal connected to data bus /DB, and N channel MOS transistor 252 has its gate terminal connected to data bus DB. A ground potential is between two N channel MOS transistors 251, 252. When read bus driver 120 outputs data and data bus DB attains the H level, N channel MOS transistor 252 is turned on and data bus /DB comes to have the ground potential. Potential rise prevention circuits 260, 270, 280 have the same structure as potential rise prevention circuit 250.

The pair of data buses DB, /DB is connected to an amplifier 180 and an output buffer 210 whereby data on the pair of data buses DB, /DB is amplified and output from a terminal 230. The pair of data buses DBA, /DBA is connected to an amplifier 190 and an output buffer 220 whereby data on the pair of data buses DBA, /DBA is amplified and output from a terminal 240.

The PRE signal output from PRE signal generation circuit 110 controls read bus drivers 120, 130, 140 connected to input/output line pairs RD0, /RD0, RD1, /RD1, . . . , RDi, /RDi as well as read bus drivers 150, 160, 170 connected to input/output line pairs RDA0, /RDA0, RDA1, /RDA1, . . . , RDAi, /RDAi.

Figure 6:
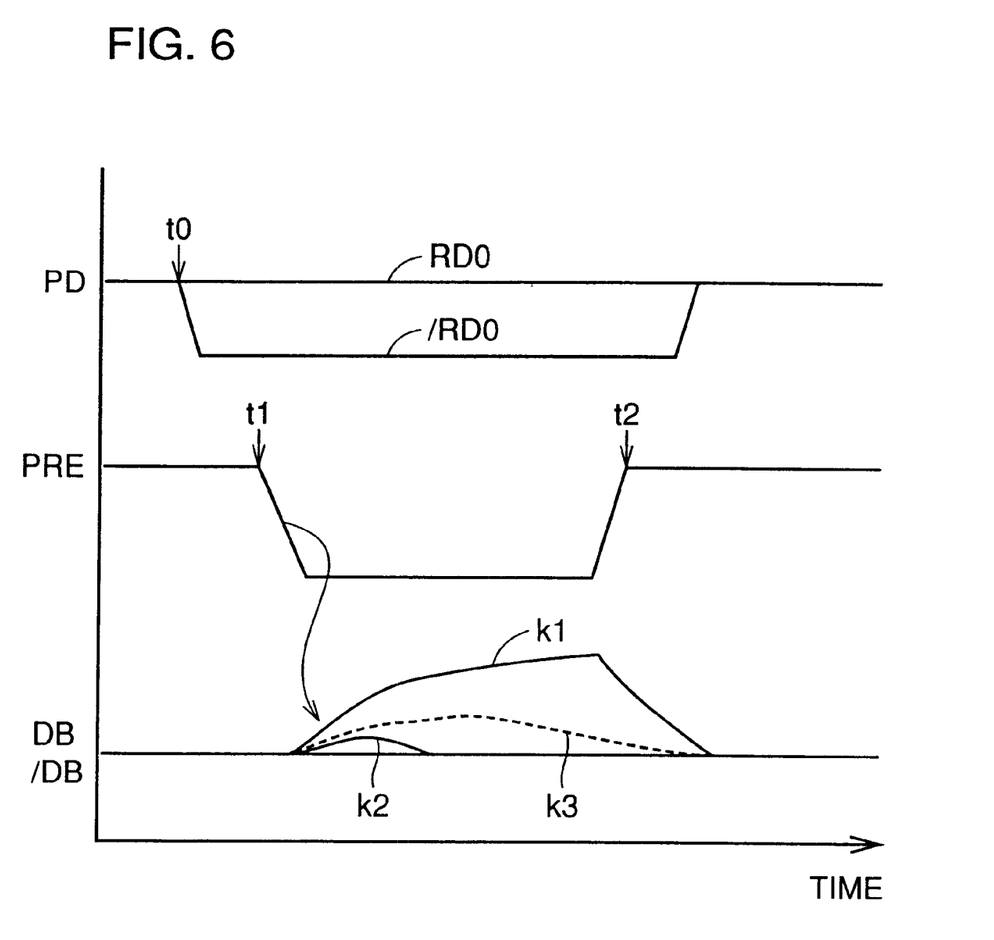
FIG. 6 is a timing chart showing the potentials of an input/output line pair, a PRE signal and a data bus pair.

Referring to FIGS. 5 and 6, transferring data on a pair of input/output lines RD0, /RD0 to amplifier 180 and output buffer 210 through a pair of data buses DB, /DB will be described. In a waiting state at or before time t0, RD0=/RD0=H level. When H level data is output from input/output line RD0 at time t0, input/output line /RD0 attains an L level. When the PRE signal for controlling a plurality of read bus drivers 120, 130, 140, 150, 160, 170 attains an L level at time t1, only read bus driver 120 connected to the pair of input/output lines RD0, /RD0 outputting data is driven, and other read bus drivers 130, 140, 150, 160, 170 assume a high impedance state. When read bus driver 120 is driven, data buses DB, /DB attain H and L levels, respectively, as described above.

In this case, if data is output to data bus pair DBA, /DBA adjacent to data bus pair DB, /DB and data bus DBA is at an H level, the potential of data bus /DB rises due to coupling from data bus DBA. That is, the potential of data bus DB rises as represented by curve k1 in FIG. 6 and the potential of data bus /DB, which should maintain a low potential, rises as represented by curve k3 in FIG. 6.

However, since potential rise prevention circuit 250 is connected between the pair of data buses DB, /DB, transition of data bus DB to the H level simultaneously turns on N channel MOS transistor 252 to fix the potential of data bus /DB at the ground potential. As a result, the potential of data bus /DB is as represented by curve k2 in FIG. 6, thus preventing potential rise of data bus /DB as compared with a case where potential rise prevention circuit 250 is not provided. As a result, the potential difference between data buses DB, /DB is made larger and coupling noise can be reduced substantially. Data output to the pair of data buses DB, /DB is amplified by amplifier 180 and output from terminal 230 through output buffer 210. Potential rise prevention circuit 250 is turned off when the pair of data buses DB, /DB are precharged.

Therefore, according to the third embodiment, noise due to coupling can be suppressed even if the interval between the data buses is made smaller, and thus the area occupied by the data buses can be reduced.

When data is output to the pair of data buses DB, /DB through read bus driver 130, potential rise prevention circuit 260 is driven. When data is output to the pair of data buses DBA, /DBA through read bus drivers 150, 160, potential rise prevention circuits 280, 270 are respectively driven. Therefore, potential rise prevention circuits 250, 260, 270, 280 are driven when the PRE signal attains the L level and their corresponding read bus drivers output data.

Data output to the pair of data buses DBA, /DBA is amplified by amplifier 190 and output from terminal 240 through output buffer 220. Potential rise prevention circuits 270, 280 are turned off when the pair of data buses DBA, /DBA are precharged.

Fourth Embodiment

Figure 7:
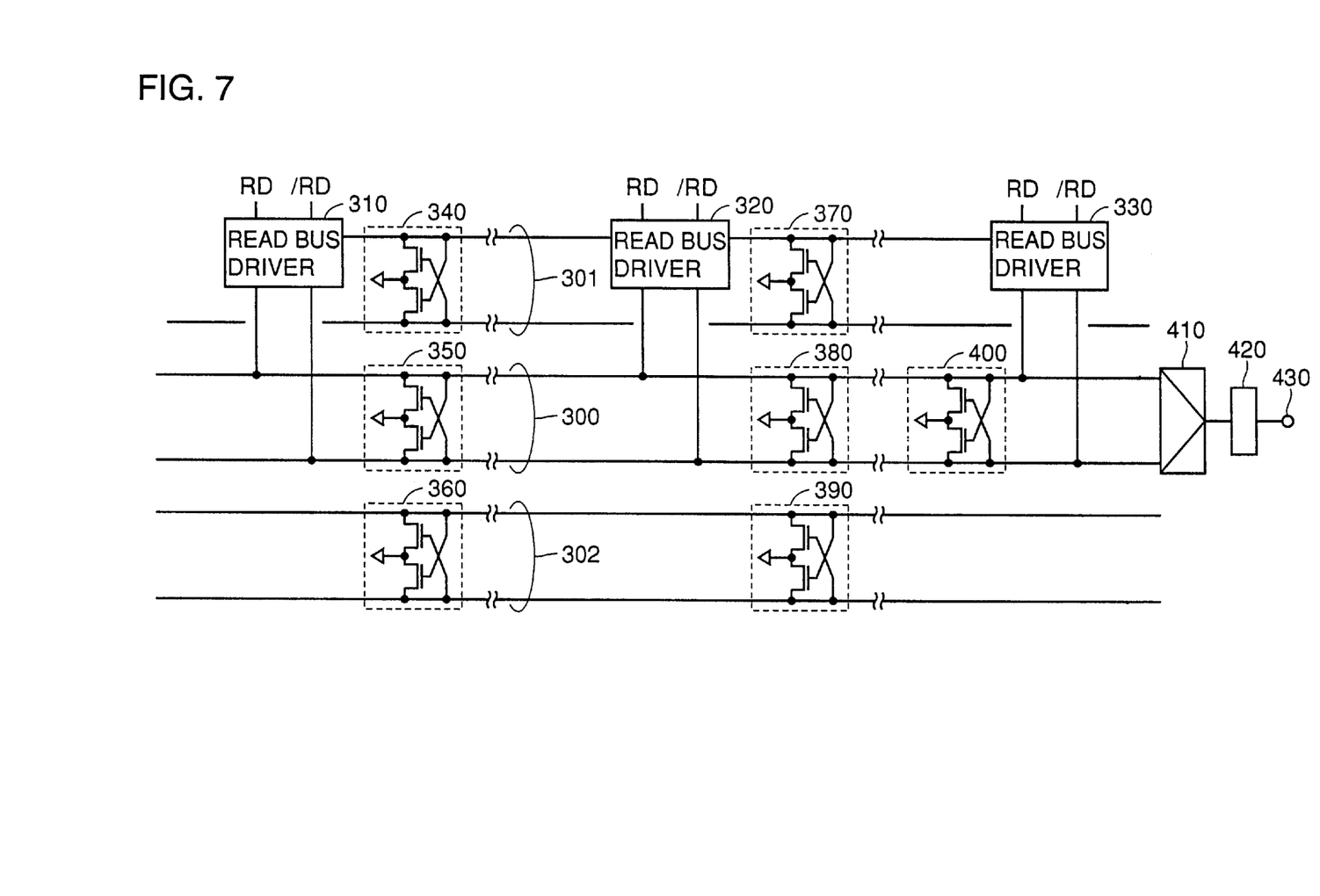
FIG. 7 is a schematic block diagram of a semiconductor integrated circuit according to a fourth embodiment.

Referring to FIG. 7, a data bus pair 300 receives data on a pair of input/output lines RD, /RD through read bus drivers 310, 320, 330 and transmits the received data to an amplifier 410. The data is amplified by amplifier 410 and output from a terminal 430 through an output buffer 420. Data bus pair 300 is provided with a potential rise prevention circuit 350 corresponding to read bus drivers 310, a potential rise prevention circuit 380 corresponding to read bus driver 320, and a potential rise prevention circuit 400 corresponding to read bus driver 330. Data bus pair 300 is adjacent to data bus pairs 301, 302. Data bus pair 301 is provided with read bus drivers 340, 370, and data bus pair 302 is provided with read bus drivers 360, 390.

When data is output to data bus pair 300 through read bus drivers 310, 320, 330, coupling noise from adjacent data bus pair 302 is suppressed by potential rise prevention circuit 350, 380, 400 according to the method described in the third embodiment. When data is output to data bus pair 301 through a read bus driver (not shown), coupling noise from adjacent data bus pair 300 is suppressed by potential rise prevention circuits 340, 370 according to the method described in the third embodiment. Furthermore, when data is output to data bus pair 302 through a read bus driver (not shown), coupling noise from an adjacent data bus pair (not shown) is suppressed by potential rise prevention circuits 360, 390 according to the method described in the third embodiment.

As described above, according to the configuration in the fourth embodiment, even if small interval and long data bus pairs are formed, dispersive arrangement of the potential rise prevention circuits for the data bus pairs at prescribed intervals can suppress coupling noise from an adjacent data bus pair and reduce the area occupied by the data bus pairs.

Fifth Embodiment

Figure 8:
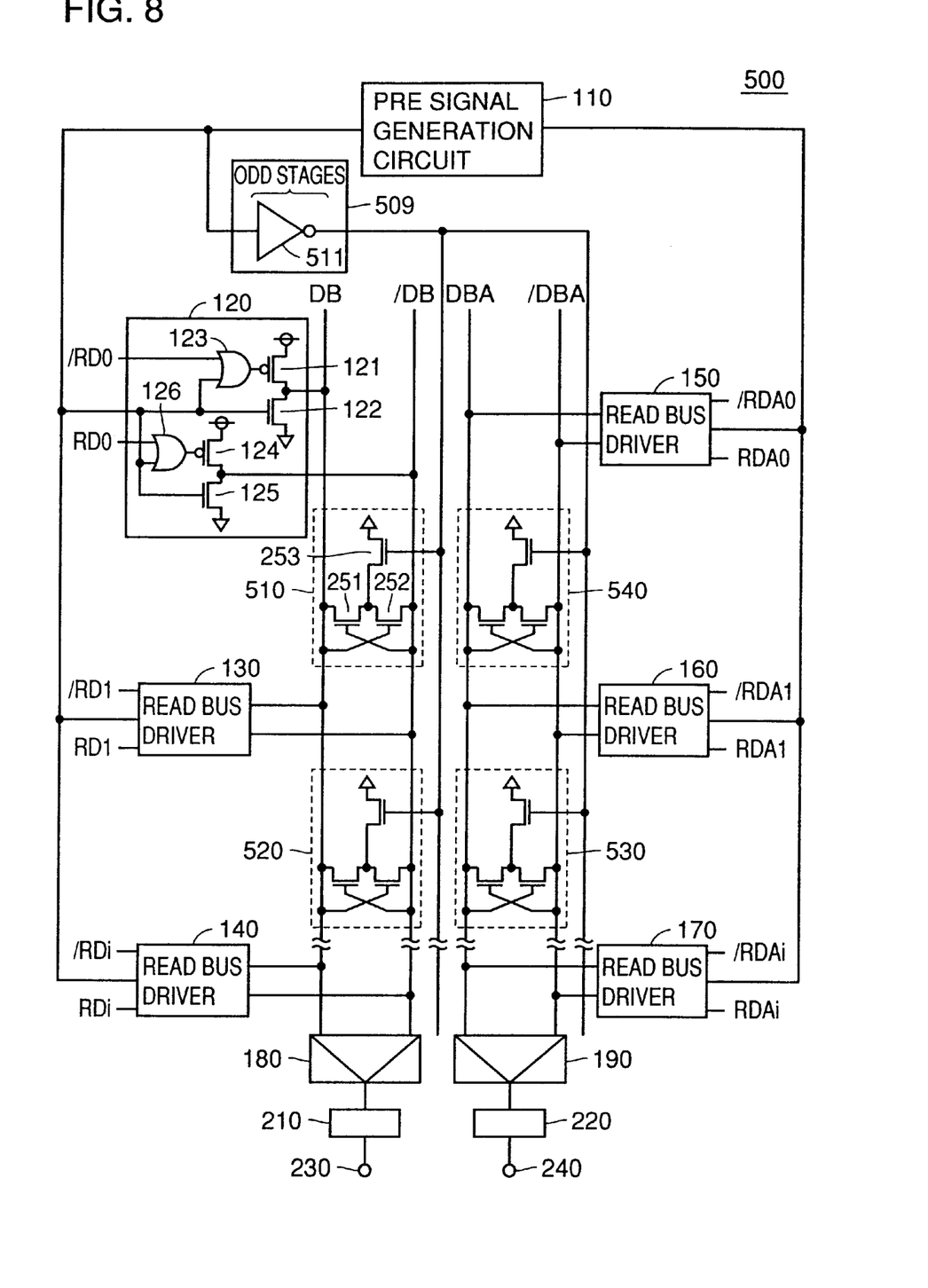
FIG. 8 is a schematic block diagram of a semiconductor integrated circuit according to a fifth embodiment.

Referring to FIG. 8, a semiconductor integrated circuit 500 is the same as above described semiconductor integrated circuit 200 except that a delay circuit 509 is added and potential rise prevention circuits 250, 260, 270, 280 are replaced by potential rise prevention circuits 510, 520, 530, 540.

Delay circuit 509 which is formed of odd stages of inverters connected in series delays a PRE signal from a PRE signal generation circuit 110 by a prescribed amount and outputs a /PRED signal. The output /PRED signal is input to potential rise prevention circuits 510, 520, 530, 540. Potential rise prevention circuit 510 which includes an N channel MOS transistor 253 in addition to the configuration of potential rise prevention circuit 250 turns on/off N channel MOS transistor 253 according to the /PRED signal. Therefore, potential rise prevention circuit 510 is controlled by the /PRED signal. Potential rise prevention circuits 520, 530, 540 have the same configuration as potential rise prevention circuit 510.

Figure 9:
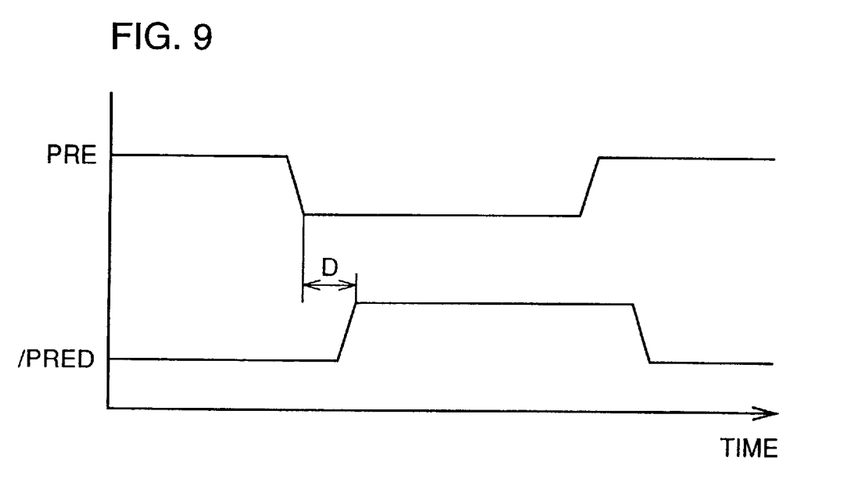
FIG. 9 is a timing chart showing PRE and /PRED signals.

Referring to FIG. 5, if H level spike noise appears on data bus /DB from adjacent data bus DBA before data bus DB makes a transition to the H level, N channel MOS transistor 251 of each of potential rise prevention circuits 250, 260 causes a malfunction, preventing transition of data bus DB to the H level. In order to prevent this problem, semiconductor integrated circuit 500 employs the /PRED signal to control driving of potential rise prevention circuits 510, 520, 530, 540. That is, the /PRED signal is caused to make a transition from the L level to the H level at timing delayed by a prescribed time period D from the timing at which the PRE signal changes from the H level to the L level as shown in FIG. 9. When the /PRED signal attains the H level, N channel MOS transistor 253 is turned on. Then, data is output to a pair of data buses DB, /DB. When data bus DB attains the H level, N channel MOS transistor 252 is turned on. It is therefore possible to prevent potential rise of data bus /DB. It is noted that the prescribed time period D is determined as such a time period that a potential difference (see curves k1, k2) between data buses DB, /DB is 50 to 100 mV when any potential rise prevention circuit is not provided in FIG. 6.

If N channel MOS transistor 253 is off, potential rise prevention circuit 510 remains to be inactive. Therefore, from the time when the PRE signal attains the L level to the time when the /PRED signal attains the H level, that is, during prescribed time period D, potential rise prevention circuit 510 will not cause a malfunction even if H level spike noise appears on data bus /DB.

Therefore, according to the configuration in the fifth embodiment, coupling noise from an adjacent data bus can be suppressed while a malfunction due to spike noise from the adjacent data bus can be prevented. As a result, the area occupied by data bus pairs can be made smaller even if the data bus pairs are provided at smaller intervals.

In connection with the fifth embodiment, Japanese Patent Laying-Open No. 4-119590 describes a latch circuit (also referred to as "full latch") which is formed by using two sets of two N channel MOS transistors connected in series, connecting the gate terminals of one set of the transistors to one data bus, and connecting the gate terminals of the other set of transistors to the other data bus. However, potential rise prevention circuits 510, 520, 530, 540 described in the fifth embodiment of the present invention employ one set of two N channel MOS transistors connected in series (also referred to as "half latch") and is different from the latch circuit described in Japanese Patent Laying-Open No. 4-119590. In other words, the use of the full latch described in Japanese Patent Laying-Open No. 4-119590 increases the amplitude of a signal output to a data bus whereas the use of the half latch described in the fifth embodiment of the present invention maintains small the amplitude of data output to a data bus. In this respect, the half latch is different from the full latch. As a result, the half latch exhibits the remarkable effect that cannot be attained by the full latch described in Japanese Patent Laying-Open No. 4-119590 in that the half latch can remove noise while maintaining a small amplitude.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor integrated circuit, comprising:

first and second banks having a plurality of memory cells and capable of being driven independently;

a first input/output circuit writing and reading data to and from a plurality of memory cells included in said first bank;

a second input/output circuit writing and reading data to and from a plurality of memory cells included in said second bank;

data buses arranged between said first and second banks and connected to said first and second input/output circuits; and a plurality of circuits arranged between said first and second banks and exchanging data with said data buses, said data buses crossing between adjacent two circuits of said plurality of circuits.

2. The semiconductor integrated circuit according to claim 1, wherein said data buses have such number of crossings that is determined based on the number of blocks obtained by dividing said first and second banks.

3. The semiconductor integrated circuit according to claim 1, wherein said data buses are formed of such number of data buses that is equal to the number of blocks obtained by dividing said first and second banks, and said data buses respectively correspond to the blocks obtained by dividing said first and second banks.

4. A semiconductor integrated circuit, comprising:

first and second banks having a plurality of memory cells and capable of being driven independently;

an input/output circuit arranged between said first and second banks and selectively writing and reading data to and from the plurality of memory cells included in said first and second banks; and a data bus inputting and outputting data through said input/output circuit.

5. The semiconductor integrated circuit according to claim 4, wherein said input/output circuit includes an amplification circuit amplifying data from the plurality of memory cells included in said first or second bank, a driver outputting the data amplified by said amplification circuit to said data bus, a buffer inputting the data from said data bus to the plurality of memory cells included in said first or second bank, and a switch selectively connecting said amplification circuit to said first or second bank.

6. The semiconductor integrated circuit according to claim 5, further comprising:

a first input/output line pair having one end connected to said first bank and another end connected to said switch; and a second input/output line pair having one end connected to said second bank and another end connected to said switch.

7. A semiconductor integrated circuit, comprising:

a first data bus pair;

a second data bus pair provided adjacent to said first data bus pair;

a first bus driver outputting data from a first memory cell array to said first data bus pair;

a second bus driver outputting data from a second memory cell array to said second data bus pair;

a first potential rise prevention circuit provided between data buses of said first data bus pair and preventing potential rise of one data bus of said first data bus pair due to coupling from said second data bus pair when said second bus driver outputs data to said second data bus pair; and a second potential rise prevention circuit provided between data buses of said second data bus pair and preventing potential rise of one data bus of said second data bus pair due to coupling from said first data bus pair when said first bus driver outputs data to said first data bus pair.

8. The semiconductor integrated circuit according to claim 7, wherein said first potential rise prevention circuit is driven according to driving of said first bus driver, and said second potential rise prevention circuit is driven according to driving of said second bus driver.

9. The semiconductor integrated circuit according to claim 7, wherein said first and second potential rise prevention circuits are provided at prescribed intervals.

10. The semiconductor integrated circuit according to claim 7, further comprising:

a delay circuit generating a first bus driver delay signal obtained by delaying by a prescribed amount a first bus driver drive signal for driving said first bus driver, and a second bus driver delay signal obtained by delaying by a prescribed amount a second bus driver drive signal for driving said second bus driver, wherein said first potential rise prevention circuit is driven according to said first bus driver delay signal, and said second potential rise prevention circuit is driven according to said second bus driver delay signal.

* * * * *